United States Patent
Ueda et al.

(10) Patent No.: US 8,330,055 B2
(45) Date of Patent: Dec. 11, 2012

(54) MAGNETIC COMPOSITE, METHOD FOR PRODUCING THE SAME, AND SHIELDING STRUCTURE

(75) Inventors: Tomoaki Ueda, Tokyo (JP); Masanori Abe, Tokyo (JP)

(73) Assignee: Empire Technology Development LLC, Wilmington, DE (US)

( * ) Notice: Subject to any disclaimer, the term of this patent is extended or adjusted under 35 U.S.C. 154(b) by 293 days.

(21) Appl. No.: 12/642,110

(22) Filed: Dec. 18, 2009

(65) Prior Publication Data

US 2010/0243313 A1 Sep. 30, 2010

(30) Foreign Application Priority Data

Mar. 30, 2009 (JP) ................................ 2009-081715

(51) Int. Cl.
*H05K 9/00* (2006.01)
*H01F 1/03* (2006.01)
*H01F 1/00* (2006.01)

(52) U.S. Cl. ........ 174/391; 174/350; 174/353; 174/396; 148/100; 148/300; 148/304

(58) Field of Classification Search ............... 148/304, 148/305, 100, 300; 174/391, 350, 353, 396; 252/62.55

See application file for complete search history.

(56) References Cited

U.S. PATENT DOCUMENTS

| | | | |
|---|---|---|---|
| 4,743,313 A * | 5/1988 | Makino et al. | 148/403 |
| 4,814,546 A | 3/1989 | Whitney et al. | |
| 4,923,533 A * | 5/1990 | Shigeta et al. | 148/304 |
| 5,211,896 A * | 5/1993 | Ward et al. | 264/126 |
| 5,453,291 A * | 9/1995 | Sasahara et al. | 427/8 |
| 5,554,232 A * | 9/1996 | Fujimoto et al. | 148/304 |
| 5,593,518 A * | 1/1997 | Ramanan | 148/304 |
| 5,798,439 A * | 8/1998 | Lefebvre et al. | 528/489 |
| 6,017,490 A * | 1/2000 | Otsuka et al. | 419/35 |
| 6,749,700 B2 * | 6/2004 | Sunakawa et al. | 148/561 |
| 6,972,097 B2 * | 12/2005 | Yoshida et al. | 252/62.54 |
| 2003/0060591 A1 * | 3/2003 | Yoshida et al. | 528/86 |

(Continued)

FOREIGN PATENT DOCUMENTS

JP 01-189200 7/1989

(Continued)

OTHER PUBLICATIONS

Machine Translation of JP 20070055667 A: Kimura et al., Metal-Jet Metallic Ball Mounting Device; Jan. 2007.*

(Continued)

*Primary Examiner* — Timothy Thompson
*Assistant Examiner* — Sherman Ng
(74) *Attorney, Agent, or Firm* — Foley & Lardner LLP

(57) ABSTRACT

The present invention provides a magnetic composite capable of enhancing the effect of shielding against electromagnetic noise and the like (magnetic shielding effect) while inhibiting a possible eddy current, and a method for producing the magnetic composite, and a shielding structure comprising the magnetic composite. A shielding member 10 as a magnetic composite contains a resin 12 which is an insulator and serves as a matrix material and into which fine powders of an amorphous metal magnetic substance 10a containing Fe, Si, and B are mixed. In the shielding member 10, a plurality of the amorphous metal magnetic substances 10a are contained in the resin 12 at a volume fraction less than a percolation threshold. The type of the amorphous metal magnetic substance 10a is not particularly limited provided that the amorphous metal contains Fe, Si, and B.

11 Claims, 1 Drawing Sheet

U.S. PATENT DOCUMENTS

| | | | |
|---|---|---|---|
| 2003/0205295 A1* | 11/2003 | Yoshida et al. | 148/108 |
| 2005/0161630 A1* | 7/2005 | Chui et al. | 252/62.51 R |
| 2007/0137732 A1* | 6/2007 | Kogure et al. | 148/101 |

FOREIGN PATENT DOCUMENTS

| | | |
|---|---|---|
| JP | 06-184607 | 7/1994 |
| JP | 07-204798 | 8/1995 |
| JP | 09-312489 | 12/1997 |
| JP | 2000-223846 | 8/2000 |
| JP | 2005-209686 | 8/2005 |
| JP | 2006-093416 | 4/2006 |
| JP | 2007-5567 A | 1/2007 |
| JP | 2007005567 A * | 1/2007 |
| JP | 2007-042907 | 2/2007 |
| JP | 2008-021991 | 1/2008 |

OTHER PUBLICATIONS

Notice of Reasons for Rejection for JP 2009-081715 mailed May 8, 2009 (with English translation).

Notice of Reasons for Rejection for JP 2009-081715 mailed Sep. 10, 2009 (with English translation).

Notice of Reasons for Rejection for JP 2009-081715 mailed Jan. 25, 2010 (with English translation).

* cited by examiner

MAGNETIC COMPOSITE, METHOD FOR PRODUCING THE SAME, AND SHIELDING STRUCTURE

CROSS REFERENCE TO RELATED APPLICATION

This application claims the benefit of Japanese Application No. 2009-81715 filed on Mar. 30, 2009 which is incorporated herein by reference.

BACKGROUND OF THE INVENTION

1. Field of the Invention

The present invention relates to a magnetic composite, a method for producing the magnetic composite, and a shielding structure.

2. Description of the Related Art

In recent years, the operating frequency of electronic devices has been increasing higher and higher. Thus, an important challenge is how to effectively shield against or suppress electromagnetic noise emitted by such electronic devices and signal noise on transmission paths in the electronic devices. As known noise suppression means, a metal sheet or a sheet comprising a resin composition containing magnetic powder is used as a shield against electromagnetic noise and signal noise (see, for example, patent document 1 below).

Patent document 1: Japanese Patent Laid-Open No. 2005-209686

Patent document 2: Japanese Patent Laid-Open No. 7-204798

However, if a metal sheet is used as such noise suppression means, a change in ambient magnetic field causes an eddy current, which is disadvantageously likely to cause the metal sheet to be heated. Thus, the electronic device may be thermally affected or cooling means may become necessary. If a sheet containing magnetic powder is used, the volume fraction of the magnetic power (the content of the magnetic powder in the magnetic powder-containing sheet) needs to be maximized in order to enhance the effect of shielding against electromagnetic noise and the like. Then, the magnetic powders contact and connect to (couple to) one another, forming many percolation paths. As a result, an eddy current is generated as is the case with the metal plate.

To allow a possible eddy current to be inhibited, the volume fraction of the magnetic power may be reduced with an equivalent magnetic shielding effect maintained. To achieve this, a magnetic substance with a higher magnetic permeability is expected to be used. As such a high magnetic-permeability, an amorphous wire is known which is described in patent document 2 above and which is a thin metal wire.

However, as described in patent document 2 (Japanese Patent Laid-Open No. 7-204798), the amorphous wire is formed to be relatively long for manufacturing reasons. Thus, unlike in the case of the magnetic powder, mixing the amorphous wire with resin to form a resin composition is difficult. Consequently, it is difficult to form the amorphous wire into a sheet adapted to shield against electromagnetic noise and the like. Furthermore, instead of forming a sheet-like resin composition, connecting (laying out) long amorphous wires together (laid) so as to form a sheet is possible. However, in this case, ambient magnetic fields are expected to change to cause an eddy current as is the case with the metal sheet.

It is thus desirable to provide a magnetic composite capable of enhancing the effect of shielding against electromagnetic noise and the like (magnetic shielding effect) while inhibiting a possible eddy current, and a method for producing the magnetic composite, and a shielding structure comprising the magnetic composite.

SUMMARY OF THE INVENTION

To solve the above-described problems, a magnetic composite according to the present disclosure comprises a plurality of amorphous metal magnetic substances containing Fe, Si, and B (that is, an Fe—Si—B-containing amorphous metal magnetic substance), which is contained in an insulator at a volume fraction less than a percolation threshold. Here, the "percolation threshold" refers to the volume fraction at which a particular volume fraction (concentration) of amorphous metal magnetic substances contained in a magnetic composite clump (aggregate) and connect together so as to form a cluster, thus exhibiting conductivity.

The magnetic composite configured as described above contains the amorphous metal magnetic substances at a volume fraction less than the percolation threshold. Consequently, generation of percolation paths corresponding to conductive paths is suppressed. Thus, even when the magnetic composite is used as means for shielding means against electromagnetic waves from the electronic device and the like, a possible eddy current is sufficiently suppressed which is caused by ambient magnetic fields generated in a conventional metal sheet and an amorphous wire sheet material. As a result, the shielding means is prevented from being heated. Furthermore, the amorphous metal substance containing Fe, Si, and B has a high magnetic permeability, thus allowing the effect of shielding against electromagnetic noise and the like to be enhanced. The enhanced shielding effect further enables a reduction in the thickness and size of the shielding means and allows the shielding means to be made transparent, flexible, and fibrous. Therefore, installation area can be reduced, and the shielding means can be used for general purposes.

Furthermore, the amorphous metal magnetic substance may have an aspect ratio of 2 to 5. Here, the "aspect ratio" refers to the ratio of the shorter one to longer one of the vertical and horizontal sizes of the amorphous metal magnetic substance. If the horizontal and vertical sizes of the amorphous metal magnetic substance are indefinite, the aspect ratio refers to the value of the ratio of the major axis to the minor axis.

An aspect ratio of higher than 5 results in an excessively long amorphous metal magnetic substance. This makes it difficult to mix the amorphous metal magnetic substance with an insulator such as resin to form a homogeneous composition as in the case of the conventional amorphous wire. That is, it is difficult to form the amorphous metal magnetic substance into a sheet adapted to shield against electromagnetic noise and the like. On the other hand, an aspect ratio of less than 2 causes the amorphous metal magnetic substance to clump readily in the insulator, thus apparently excessively increasing the size of grains of the amorphous metal magnetic substance. This causes percolation paths to be readily formed. That is, when the aspect ratio of the amorphous metal magnetic substance is between 2 and 5, the percolation threshold can be easily increased, thus allowing an increase in the content of the amorphous metal magnetic substance in the magnetic composite. As a result, the effect of shielding against electromagnetic noise and the like can further be enhanced.

Specifically, the insulator may be a solid or a liquid substance (including a liquid). If the insulator is a solid, the magnetic composite can be formed into sheet, fiber, yarn, fabric, clothing, a building material for windows, walls, or the like, or a material for the bodies of vehicles, ships, and airplanes. If the insulator is a liquid substance, the magnetic substance can be easily applied, like a coating material, to an article or a site which needs to be shielded from electromagnetic noise and the like. A dried and solidified liquid substance belongs to the solid.

Moreover, the insulator may be translucent (transparent). As described above, according to the magnetic composite of the present disclosure, the high magnetic permeability of the amorphous metal magnetic substance containing Fe, Si, and B serves to exert a sufficient effect of shielding against electromagnetic noise and the like even if the content of the amorphous metal magnetic substance is reduced. Thus, if the insulator is translucent (transparent), an electronic device, for example, covered with the magnetic composite can offer improved visibility.

Furthermore, a method for producing (manufacturing) a magnetic composite according to the present disclosure is one of the methods for effectively producing a magnetic composite according to the present disclosure. The method involves melting metal containing Fe, Si, and B, ejecting the melted metal through a nozzle in a pulse form, cooling the ejected metal to form an amorphous metal magnetic substance, and mixing a plurality of the amorphous metal magnetic substances into an insulator at a volume fraction equal to or less than the percolation threshold.

In view of this, the magnetic composite according to the present disclosure can be expressed to be produced by melting metal containing Fe, Si, and B, ejecting (jetting) the melted metal through a nozzle in a pulse form, cooling the ejected metal to form an amorphous metal magnetic substance, and mixing a plurality of the amorphous metal magnetic substances into an insulator at a volume fraction equal to or less than the percolation threshold. In this case, the melted metal may be ejected in a pulse form (in a pulsed manner) by continuous ejections at constant time intervals, intermittent ejections at different time intervals, or a combination thereof.

According to the above-described method, the melted metal containing Fe, Si, and B is ejected through the nozzle in a pulse form and thus cooled. This prevents the resulting amorphous metal magnetic substance from being excessively long, and for example, easily provides the amorphous metal magnetic substance with an aspect ratio of 2 to 5. Furthermore, a plurality of the amorphous metal magnetic substances is mixed into the insulator at a volume fraction equal to or less than the percolation threshold. Thus, the magnetic composite can be reliably formed to have an excellent shielding capability according to the present disclosure.

In this case, a refrigerant may be ejected toward the ejected metal through the nozzle in a pulse form. In other words, the melted metal and the refrigerant can be usefully ejected (jetted) at the same time (the ejections are synchronized). Then, an appropriate amount of refrigerant can be reliably supplied to a piece of the melted metal ejected in a pulse form. This serves to improve productivity and to reduce producing costs.

Furthermore, to allow the melted metal to be ejected in a pulse form, an ink jet scheme (system) may be used which is excellent in micro controllability for ejection amount, ejection timing, ejection intervals, and the like. Additionally, the following may be used for cooling: a water cooling scheme using water as a refrigerant or a vortex scheme for allowing the refrigerant, the melted metal, or both thereof to flow and diffuse spirally.

Furthermore, the shield structure according to the present disclosure may include a source of electromagnetic noise and the like, that is, an electronic device (which may include a conductor such as a signal line or a power line which is connected to the electronic device or may comprise only the conductor), and a plurality of amorphous metal magnetic substances containing Fe, Si, and B and contained in an insulator at a volume fraction equal to or less than a percolation threshold.

More specifically, examples of the electronic device include an active electronic component such as a semiconductor element, a passive electronic component such as a capacitor or an LC filter, an electronic circuit board or an electronic instrument on which the active and passive electronic components are mounted, an electromagnetic wave generating instrument such as an electromagnetic cooking machine which comprises the electronic circuit board or the electronic instrument, and an article, an apparatus, a facility, a housing, or a vehicle in which the electromagnetic wave generating instrument is accommodated. The shield structure according to the present disclosure includes any of these electronic devices and the magnetic composite according to the present disclosure.

Owing to a high magnetic permeability, the magnetic composite according to the present disclosure may be used as a core member of a motor or a rotor or a core member of an acceleration tube of an accelerator.

DETAILED DESCRIPTION OF THE PREFERRED EMBODIMENTS

Figure 1:
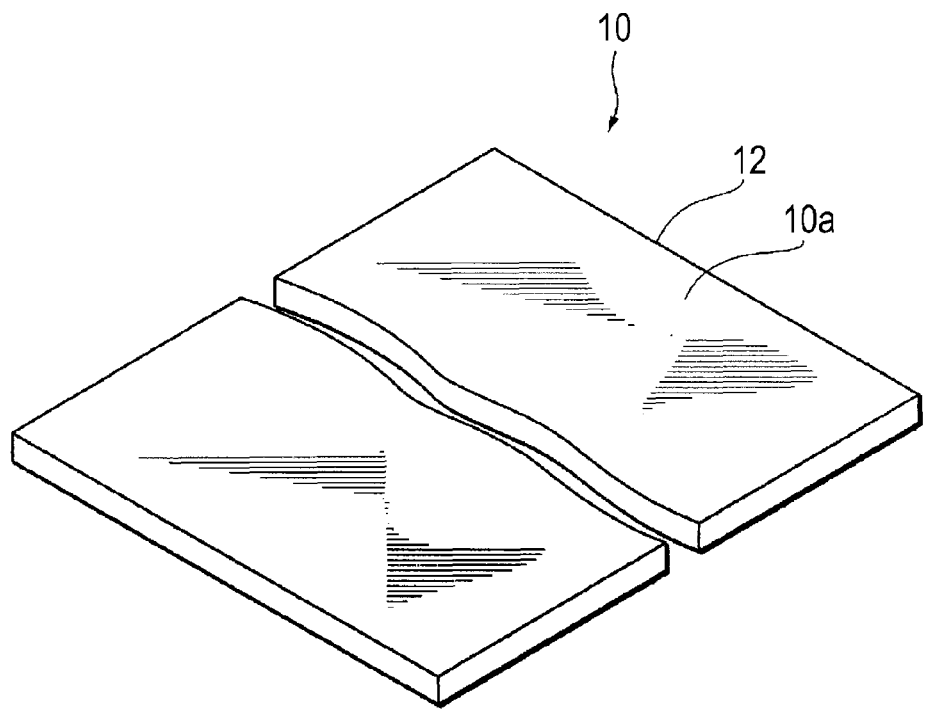
FIG. 1 is a perspective view schematically showing the configuration of a preferred embodiment of a magnetic composite according to the present disclosure.

Embodiments of the present disclosure will be described below with reference to the drawings. In the drawings, the same components are denoted by the same reference numerals, and duplicate descriptions are omitted. The vertical and lateral positional relationships are based on those shown in the drawings unless otherwise specified. Moreover, dimensional ratios are not limited to those shown in the drawings. Furthermore, the embodiments described below are illustrative and are not intended to limit the present disclosure to the embodiments. Moreover, the present disclosure may undergo many variations without departing from the spirit thereof.

FIG. 1 is a perspective view schematically showing the configuration of a preferred embodiment of a magnetic composite according to the present disclosure (the magnetic composite is partly omitted). A shielding member 10 (magnetic composite) comprises a resin 12 (an insulator) serving as a matrix material and into which fine powders of an amorphous metal magnetic substance 10a containing Fe, Si, and B are mixed. In the shielding member 10, the resin 12 contains a plurality of the amorphous metal magnetic substances 10a at a volume fraction less than a percolation threshold.

The type of the amorphous metal magnetic substance 10a is not particularly limited provided that the amorphous metal contains Fe, Si, and B. For example, an Fe—Si—B-containing amorphous alloy, which is ternary, a quarternary or higher amorphous alloy may be used which contains the above-described three elements and at least one of the elements P, Al, Ni, Cu, Mo, Co, Nb, Mn, Hf, Zr, Sm, and Ta. Moreover, the amorphous metal magnetic substance 10a may further contain a nonmetal element such as F, O, or N and any other avoidable impurities.

The amorphous metal magnetic substance 10a can be produced (manufactured), for example, as follows. First, a mother alloy is melted which contains an appropriate composition (stoichiometry) of Fe, Si, and B. Then, the melted metal is ejected into a refrigerant in a pulse form through a fine nozzle that resists a melted metal temperature, by means of an ink jet scheme that uses a piezoelectric element. The melted metal is then cooled and solidified to form an amorphous metal magnetic substance 10a shaped like a predetermined column, plate, or needle and having a predetermined aspect ratio.

Fine powders of the amorphous metal magnetic substance 10a thus obtained are mixed and kneaded with an uncured resin 12 (polymer) or a polymerizable monomer. Thereafter, the resin 12 is cured or the monomer is polymerized and cured into the resin 12. A shielding member 10 is thus obtained.

Here, the type of the resin 12 is not particularly limited and may be, for example, any of various thermoplastic composition resin or thermosetting resin. Specifically, examples of the resin 12 include an acrylic resin, a polyacrylate resin, a polyetherimide resin, a polyimide resin, a vinylbenzyl resin, a polyvinyl benzyl ether compound resin, a polyphenylene ether resin, a bismaleimide triazine resin, a cyanate ester resin, an epoxy resin, an epoxy+active ester cured resin, a cured polyolefin resin, a benzo cyclobutene resin, an aromatic polyester resin, an aromatic crystal polyester resin, a polyphenylene sulfide resin, a polyether ether ketone resin, a fluorine resin, an epoxy resin, a phenol resin, or a benzo oxazine resin, or any of these resins to which a filler such as an appropriate inorganic oxide or fibers is added.

In the shielding member 10 configured as described above, the amorphous metal magnetic substance 10a is mixed with the resin 12 at a volume fraction less than the percolation threshold. Thus, generation of percolation paths corresponding to conductive paths is suppressed. Consequently, even when the shielding member 10 is used as means for shielding against electromagnetic waves from an electronic device, a possible eddy current can be sufficiently inhibited which results from ambient (peripheral) magnetic fields generated in a conventional metal sheet or a sheet material for an amorphous wire. This allows the shielding member 10 to be inhibited from being heated. Therefore, the electronic device can be prevented from being thermally affected, eliminating the need for cooling means.

Furthermore, the shielding member 10 contains the amorphous metal magnetic substance 10a containing Fe, Si, and B, which offers a high magnetic permeability. Thus, the shielding member 10 enhances the effect of shielding against electromagnetic noise and the like. The thus improved shielding effect in turn enables a reduction in the thickness and size of the shielding member 10 and allows the shielding member 10 to be made transparent, flexible, and fibrous. Thus, installation area is reduced, and the shielding member 10 can be used for general applications. Moreover, the amorphous metal magnetic substance 10a itself functions as a filler without the need to add such a filler as described above to the resin 12. Thus, the mechanical strength of the shielding member 10 can be improved with the flexibility thereof maintained (prevented from being hindered).

Moreover, when the amorphous metal magnetic substance 12 has an aspect ratio of 2 to 5, the following tendency results. That is, an aspect ratio of at most 5 prevents the amorphous metal magnetic substance 10a from being excessively long. This allows a composition equivalent to the resin 12 to be easily formed. The composition can further be easily formed into a sheet like the shielding member 10 as shown in the figures. On the other hand, an aspect ratio of at least 2 enables the amorphous metal magnetic substance 10a to be inhibited from being easily clumped in the resin 12. This enables the prevention of an apparent excessive increase in the size of grains in the amorphous metal magnetic substance 10a and the resultant easy formation of percolation paths.

As described above, when the aspect ratio of the amorphous metal magnetic substance 10a is between 2 and 5 allows the percolation threshold to be easily increased. Thus, the content of the amorphous metal magnetic substance 10a in the shielding member 10 can be increased. As a result, the effect of shielding against electromagnetic noise and the like can further be improved.

Figure 2:
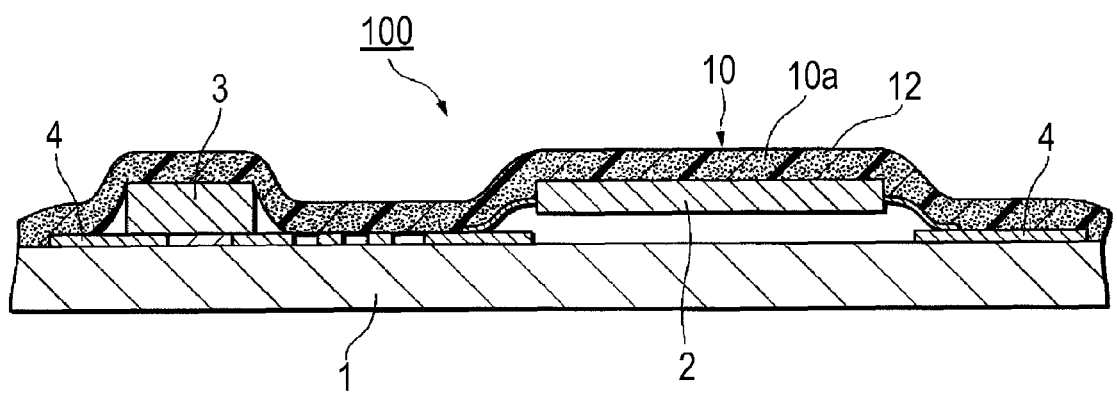
FIG. 2 is a schematic sectional view showing the configuration of a preferred embodiment of a shield structure according to the present disclosure which uses an example of the magnetic composite according to the present disclosure.

FIG. 2 is a schematic sectional view showing the configuration of a preferred embodiment of a shielding structure according to the present disclosure which uses an example of the magnetic composite according to the present disclosure. A shielded printed circuit board 100 (shielding structure) comprises a printed circuit board 1 on which a semiconductor device 2 (semiconductor package or semiconductor chip) and another electronic component 3 are mounted. The shielded printed circuit board 100 further comprises a wiring circuit 4 and the like which connects the semiconductor device 2 and the electronic component 3 together. Furthermore, the shielding member 10 is installed so as to cover the tops of the semiconductor device 2, the electronic component 3, the wiring circuit 4, and the like.

In the shielded printed circuit board 100 configured as described above, the shielding member 10, which has the excellent capability of shielding against electromagnetic noise as described above, allows electromagnetic noise (conductive noise and radiation noise) from the semiconductor device 2, the electronic component 3, the wiring circuit 4, or the like to be sufficiently shielded and suppressed. Hence, the adverse effects on external instruments can be sufficiently reduced. Furthermore, the shielding member 10 is precluded from undergoing an eddy current, thus preventing thermal effects on the semiconductor device 2, the electronic component 3, the wiring circuit 4, and the like which are caused by heating. Furthermore, in contrast, shielding member 10 serves to shield against external noise (electromagnetic wave) traveling from the outside to inside of the shielded printed circuit board 100. As a result, the semiconductor device 2, the electronic component 3, the wiring circuit 4, and the like can be prevented from disadvantageously malfunctioning because of the external noise.

As described above, the present disclosure is not limited to the above-described embodiments. Many variations may be made to the embodiments without departing from the spirit of the present invention. For example, the shielding member 10 is not limited to the resin 12 but may be a rubber material or another inorganic insulating material. Furthermore, the shielding member 10 may be a liquid substance instead of a solid. Moreover, the shielding member 10 is not limited to a sheet but may be formed into fiber, yarn, woven or knitted fiber or yarn, fabric, clothing (for applications for protecting human bodies from electronic noise), a building material for windows, walls, and the like, or a material for the bodies of vehicles, ships, airships, and the like. When the shielding member 10 is a liquid substance, the magnetic composite may be applied, like a coating material, to an article or a site which needs to be shielded from electromagnetic noise and the like. Moreover, the technique to eject the melted mother alloy of the amorphous metal magnetic substance 10a is not limited to the ink jet scheme. Alternatively, the refrigerant may be ejected toward the melted metal through the nozzle in a pulse form.

As described above, according to the magnetic composite, the method for producing the magnetic composite, and the shielding structure according to the present disclosure, the magnetic composite used as shielding means for an electronic device enables the effect (magnetic shielding effect) of shielding against electromagnetic noise and the like to be drastically improved while suppressing generation of an eddy current. Hence, the magnetic composite, producing method, and shielding structure according to the present disclosure can be widely and effectively utilized in electronic devices, apparatuses, instruments, systems, facilities, and the like which are used in the fields of electronic engineering, electric engineering, optical communication, radio communication, wired communication, and the like. Furthermore, the magnetic composite and producing method according to the present disclosure can be widely and effectively utilized in magnetic materials in general and in industrial fields in general for which shielding against electronic noise is required.

What is claimed is:

1. A magnetic composite produced by:
   melting metal containing Fe, Si, and B;
   ejecting the melted metal through a nozzle in a pulse form;
   ejecting a refrigerant toward the ejected metal through the nozzle in a pulse from;
   cooling the ejected metal to form an amorphous metal magnetic substance; and
   mixing a plurality of the amorphous metal magnetic substances into an insulator at a volume fraction equal to or less than the percolation threshold.

2. A method for producing a magnetic composite, the method comprising:
   melting metal containing Fe, Si, and B;
   ejecting the melted metal through a nozzle in a pulse form;
   ejecting a refrigerant toward the ejected metal through the nozzle in a pulse from;
   cooling the ejected metal to form an amorphous metal magnetic substance; and
   mixing a plurality of the amorphous metal magnetic substances into an insulator at a volume fraction equal to or less than the percolation threshold.

3. The magnetic composite according to claim 2, wherein the insulator is translucent.

4. The method for producing the magnetic composite according to claim 2, wherein the amorphous metal magnetic substance is formed to have an aspect ratio of 2 to 5.

5. The magnetic composite of claim 1, wherein the magnetic composite is formed into a fiber, yarn, or fabric.

6. The method for producing the magnetic composite according to claim 2, wherein the insulator includes an uncured resin or polymerizable monomer.

7. The method for producing the magnetic composite according to claim 2, wherein the insulator includes a rubber or inorganic material.

8. The method for producing the magnetic composite according to claim 2, wherein the insulator is a liquid, and further comprising:
   coating the insulator onto an electronic device in liquid form; and
   allowing the insulator to dry or solidify.

9. The method for producing the magnetic composite according to claim 2, further comprising:
   forming the magnetic composite into a fiber, yarn, or fabric.

10. The method for producing the magnetic composite according to claim 2, wherein the refrigerant and the melted metal are ejected at the same time.

11. The method for producing the magnetic composite according to claim 2, wherein cooling the ejected metal to form the amorphous metal magnetic substance comprises:
    allowing the refrigerant, the melted metal, or both to flow and diffuse spirally.

* * * * *

UNITED STATES PATENT AND TRADEMARK OFFICE
CERTIFICATE OF CORRECTION

PATENT NO. : 8,330,055 B2  Page 1 of 1
APPLICATION NO. : 12/642110
DATED : December 11, 2012
INVENTOR(S) : Ueda et al.

It is certified that error appears in the above-identified patent and that said Letters Patent is hereby corrected as shown below:

In Column 1, Line 31, delete "209686" and insert -- 209686. --, therefor.

In Column 1, Line 32, delete "7-204798" and insert -- 2007-204798. --, therefor.

In Column 4, Line 64, delete "quarternary" and insert -- quaternary --, therefor.

In Column 7, Line 27, in Claim 1, delete "from;" and insert -- form; --, therefor.

In Column 7, Line 38, in Claim 2, delete "from;" and insert -- form; --, therefor.

Signed and Sealed this
Ninth Day of April, 2013

Teresa Stanek Rea
*Acting Director of the United States Patent and Trademark Office*